United States Patent
Atallah et al.

(10) Patent No.: US 6,798,858 B1
(45) Date of Patent: Sep. 28, 2004

(54) LOCK DETECTOR FOR DELAY OR PHASE LOCKED LOOPS

(75) Inventors: Francois Ibrahim Atallah, Raleigh, NC (US); David John Seman, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/497,962

(22) Filed: Feb. 4, 2000

(51) Int. Cl.[7] .............................. H03D 3/24; H03L 7/06
(52) U.S. Cl. ...................................... 375/373; 370/516
(58) Field of Search .............................. 375/371, 373, 375/376; 327/147, 156; 370/516; 331/1 R, 11

(56) References Cited

U.S. PATENT DOCUMENTS

| | | | |
|---|---|---|---|
| 4,970,475 A | 11/1990 | Gillig | 331/25 |
| 5,111,160 A * | 5/1992 | Hershberger | 331/1 A |
| 5,189,379 A | 2/1993 | Saito et al. | 331/1 A |
| 5,327,103 A | 7/1994 | Baron et al. | 331/1 A |
| 5,359,635 A | 10/1994 | Atriss et al. | 377/39 |
| 5,394,444 A | 2/1995 | Silvey et al. | 375/374 |
| 5,410,571 A | 4/1995 | Yonekawa et al. | 375/376 |
| 5,485,484 A * | 1/1996 | Williams et al. | 375/376 |
| 5,525,932 A | 6/1996 | Kelkar et al. | 331/1 A |
| 5,539,357 A | 7/1996 | Rumreich | 331/17 |
| 5,699,020 A * | 12/1997 | Jefferson | 331/17 |
| 5,818,304 A * | 10/1998 | Hogeboom | 331/11 |
| 5,870,002 A | 2/1999 | Ghaderi et al. | 331/17 |
| 5,886,582 A | 3/1999 | Stansell | 331/1 A |
| 5,905,410 A | 5/1999 | Holmes et al. | 331/1 A |
| 5,956,379 A | 9/1999 | Tarleton | 375/376 |
| 6,265,902 B1 * | 7/2001 | Klemmer et al. | 327/2 |

FOREIGN PATENT DOCUMENTS

EP            0 866 559 A1 *    9/1998

* cited by examiner

Primary Examiner—Young T. Tse
(74) Attorney, Agent, or Firm—Scott W. Reid; Winstead, Sechrest & Minick, P.C.

(57) ABSTRACT

The present invention discloses a lock indicator circuit used to indicate a phase lock condition between logic signals. The lock indicator circuit uses a phase detector that generates a pulse width proportional to the phase difference between a reference signal and a feedback signal. Another circuit generates, on each positive edge of the reference and the feedback signals, pulses whose widths are primarily dependent on fixed delay elements. These fixed pulse determine a window in which the pulse from the phase detector will fall as the two signals approach phase lock. Phase lock is signaled by the logic AND of the window pulse and the phase detector pulse. Other circuitry generates a phase lock indication signal if the phase lock signal remains true for a number of consecutive transitions of the reference signal. Likewise a phase unlock indication signal is generated if after phase lock indication, phase unlock occurs and remains for a number of consecutive transitions of the reference signal.

33 Claims, 8 Drawing Sheets

LOCK DETECTOR FOR DELAY OR PHASE LOCKED LOOPS

TECHNICAL FIELD

The present invention relates in general to data processing systems, and in particular, to circuitry for detecting when a delay locked or phase locked loop is in a locked or unlocked condition.

BACKGROUND INFORMATION

The use of phase locked loops (PLLs) or delay locked loops (DLLs) is common for clock synthesis and synchronization. These sophisticated analog circuits lock to an incoming reference frequency signal and thus provide a synthesized and synchronized clock for use in many applications such a communications, digital processing, microprocessing, etc. Phase locking is a dynamic process that begins when an input data signal is applied to a phase locking circuit. A reference signal is the other input to the phase locking circuit. When the input data signal is applied, an error signal is generated which is applied to a feedback correction circuit that operates to reduce the value of the error signal. A phase locked loop circuit, like any feedback circuit, has a characteristic response that is determined by the values of circuit elements. Typical of feedback circuits, it takes some time for the circuit to stabilize to an acceptable error condition. For a phase locked loop the circuit would stabilize at an acceptable phase error and after stabilization the synchronization will remain locked provided the input data signal does not change at a rate outside the dynamics of the particular circuit. The lock time of a typical PLL may vary three to four times from a best to a worst case determined by variables comprising temperature, power supply, etc. Because of this variation, for applications using a PLL without a lock indicator, the longest possible lock time is used to insure that the PLL has acquired a lock condition. In a noisy environment, the lock point could be missed, and the PLL potentially could require two or three times a typical lock time "searching" for the lock point. Because of these considerations designers specify a very inflated lock time and thus may cause degradation to a system's performance. There is a need for a lock indication method for PLLs or DLLs that will reduce lock time and give a reliable indication when a phase locked loop is locked.

SUMMARY OF THE INVENTION

The present invention employs a circuit that generates a pulse with a width proportional to the phase error between two signals and a pulse when the lagging signal occurs. As the two signals approach phase lock the two pulses become approximately equal. Another similar circuit generates pulses of fixed width dependent on delay elements on each positive edge of the two signals generating a window signal. When the two signals approach phase lock, the pulses generated by the phase detector will fall within the window signal and will have a phase error dependent on the delay of the delay element. Logic that ANDs the phase detector pulse and the window pulse generates a phase lock signal. Additional circuits generate a phase lock indicator if the phase lock signal is true for a number of consecutive transitions of the reference signal. Likewise a phase lock indication is generated if after a phase lock indication the phase lock signal is false for a number of consecutive transitions of the reference signal. In this manner, noise transients and other spurious signals are masked preventing false indications of phase lock or unlock on two signals.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
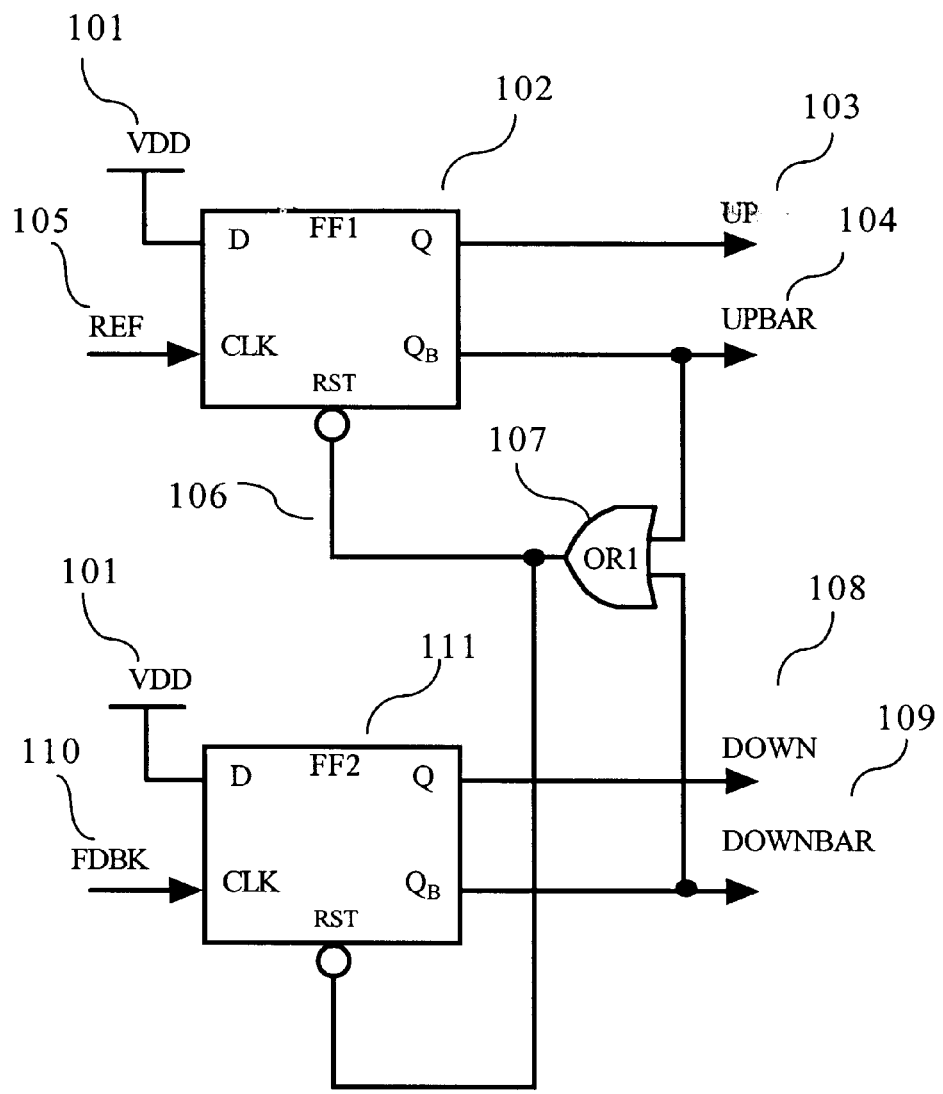
FIG. 1 is a circuit diagram of a prior art phase/frequency detector.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning specific timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
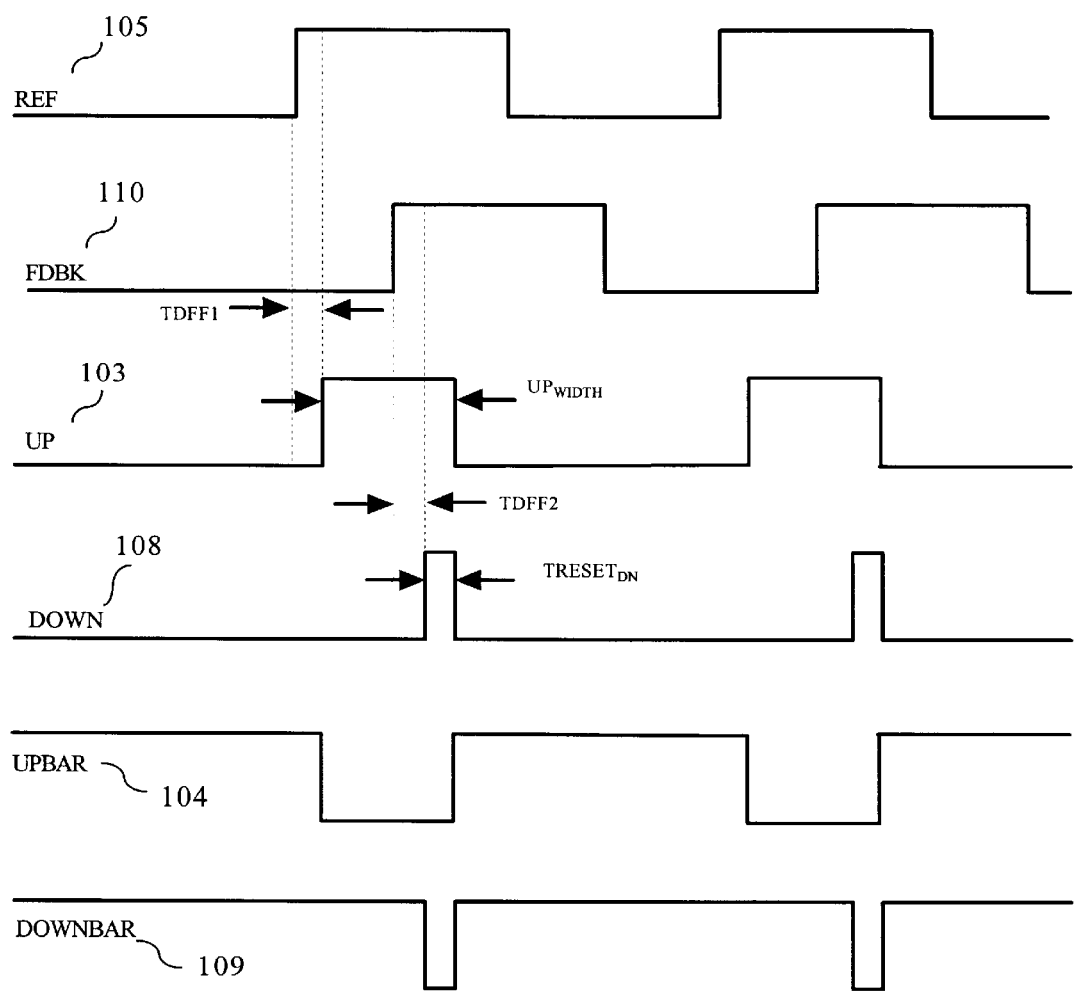
FIG. 2 is an illustration of the waveforms from the prior art phase/frequency detector.

FIG. 1 is a diagram of a circuit used in prior art phase locked loops. UP 103 and DOWN 108 are logic signals that indicate a relationship between logic signals REF 105 and FDBK 110. The waveforms for the case where the circuit is employed to phase lock two signals of the same frequency are shown in FIG. 2. FF1 102 and FF2 111, shown in FIG. 1, are data latches or D-latches known in the art. A D-latch is one that has a "Q" output (positive true) that follows the D input (data) whenever the clock (CLK) is in one state and latches the value of the D input whenever the clock goes to the other state. A reset (RST) on a D-latch will set the Q output to a logic zero. In the example of FIG. 1, the D input is coupled to a positive power supply voltage VDD 101. The Q output (UP 103) will be set to a logic zero if the output 106 of OR gate OR1 107 is at a logic zero. The output 106 of OR1 107 is at a logic one if either UPBAR 104 or DOWNBAR 109 are at a logic one. Since both FF1 102 and FF2 111 have their inverted outputs "$Q_B$" set to zero whenever the CLK inputs REF 105 and FDBK 110 go positive, UP 103 and DOWN 108 have pulse widths that are a measure of how much lead or lag exists between REF 105 and FDBK 110. In FIG. 2, $UP_{WIDTH}$ is a measure of how much FDBK 110 lags REF 105. TDFF1 illustrates a delay time before UP 103 goes positive once REF 105 goes positive. Correspondingly, $TRESET_{DN}$ represents the time that it takes a FF2 111 to reset after it is set. $TRESET_{DN}$ undergoes a delayed time TDFF2 propagating through FF2 111. UPBAR 104 and DOWNBAR 109 are the complements of UP 103 and DOWN 108.

Figure 3:
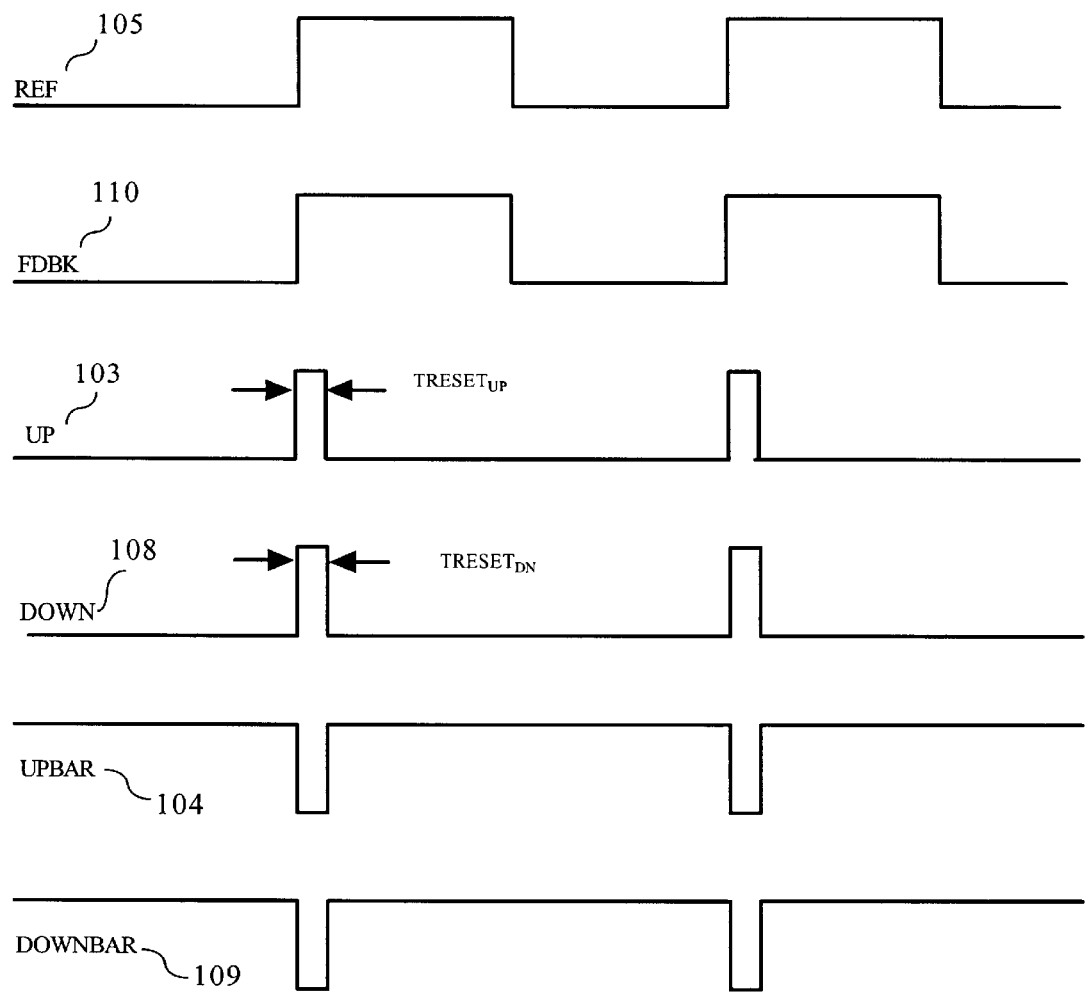
FIG. 3 is an illustration of the waveforms from the prior art phase/frequency detector when in lock.

FIG. 3 illustrates waveforms of the circuit of FIG. 1 when REF 105 and FDBK 110 are locked. When REF 105 and FDBK 202 both go positive simultaneously, during lock, the widths of UP 103 and DOWN 108 are determined only by the reset times $TRESET_{UP}$, and $TRESET_{DN}$ of FF1 102 and FF2 111 respectively. UPBAR 104 and DOWNBAR 109 are again complement outputs of FF1 102 and FE2 111 respectively.

The signal FDBK 110 is an exemplary signal, in embodiments of the present invention, which is being altered to bring it into phase lock with and exemplary reference signal REF 105. $UP_{WIDTH}$, in this case, would be a measure of an error which reduces to a minimal value (depending on gate delays) whenever FDBK 110 and REF 105 are phase locked.

Figure 5:
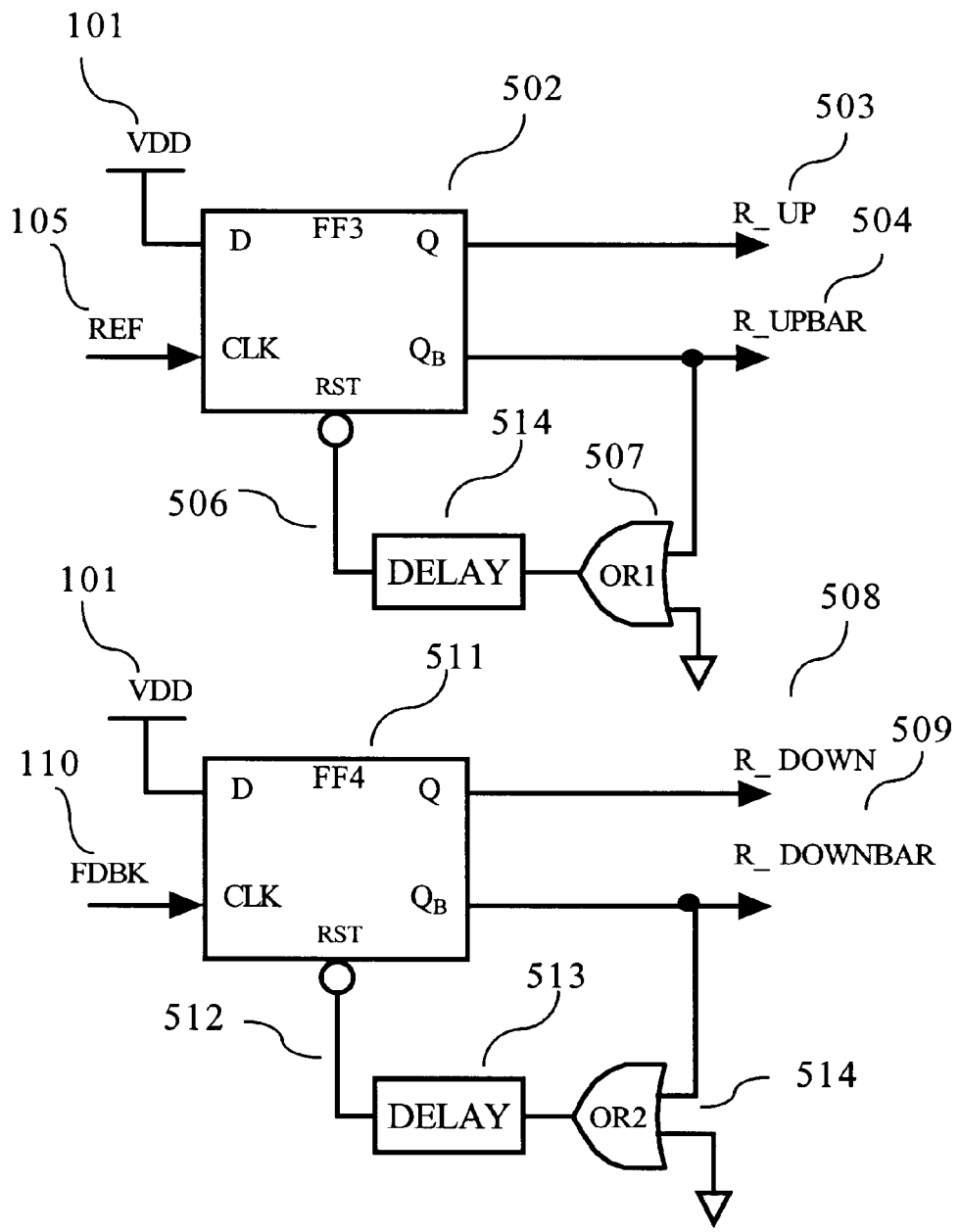
FIG. 5 is a circuit diagram showing details of a circuit function used in embodiments of the present invention.

The circuit in FIG. 5 is an embodiment of the present invention operable to generate pulses on the rising edges of exemplary reference signal REF 105 and feedback signal FDBK 110. FIG. 5 illustrates a modification of the phase detector illustrated in FIG. 1. In this modified phase detector of FIG. 5, a delay 514 and delay 513 are inserted in the reset paths of FF3 502 and FF4 511 respectively. The two circuits comprising FF3 502 and FF4 511 are used to generate pulses on every rising edge of input signals REF 105 and FDBK 110, the CLK signals of FF3 502 and FF4 511 respectively. On each rising edge of REF 105. for example, FF3 502 sets its output R_UP 503 to a logic one with VDD 101 as the data input. The output OR gate OR1 507 will go to a logic zero and after the delay of DELAY 514 and will reset FF3 501 via RST 506. The propagation delays of the OR gate OR1 507 and the DELAY 514 set the width of the pulse on output R_UP 503. R_DOWN 508 is set in a like manner using FF4 511, DELAY 513 and OR2 514 and RST 512. R_UPBAR 504 and R_DOWNBAR 509 are the complements of R_UP 503 and R_DOWN 508 respectively.

Figure 6:
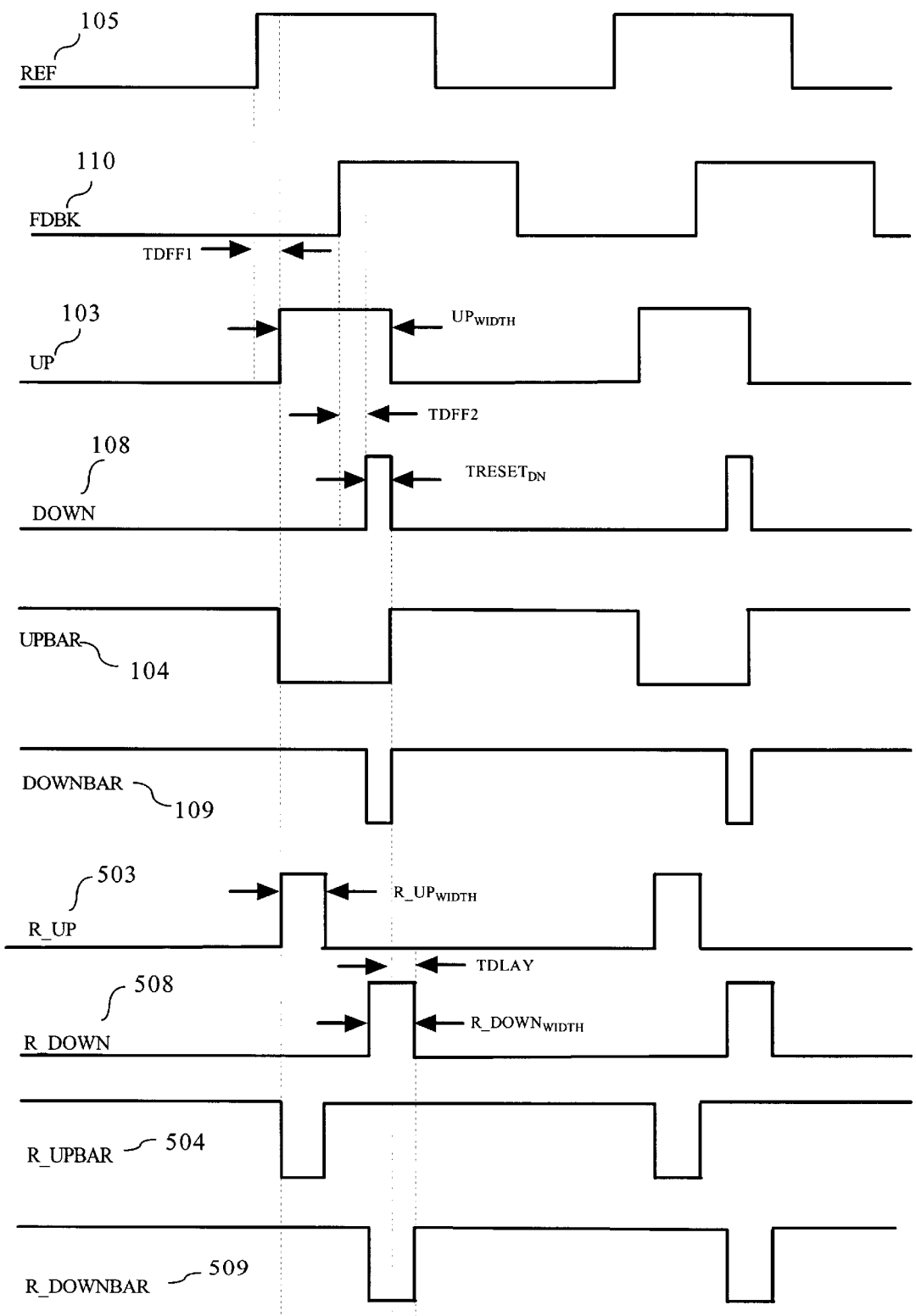
FIG. 6 is an illustration of waveforms illustrating timings and relationships of signals in embodiments of the present invention.
Figure 7:
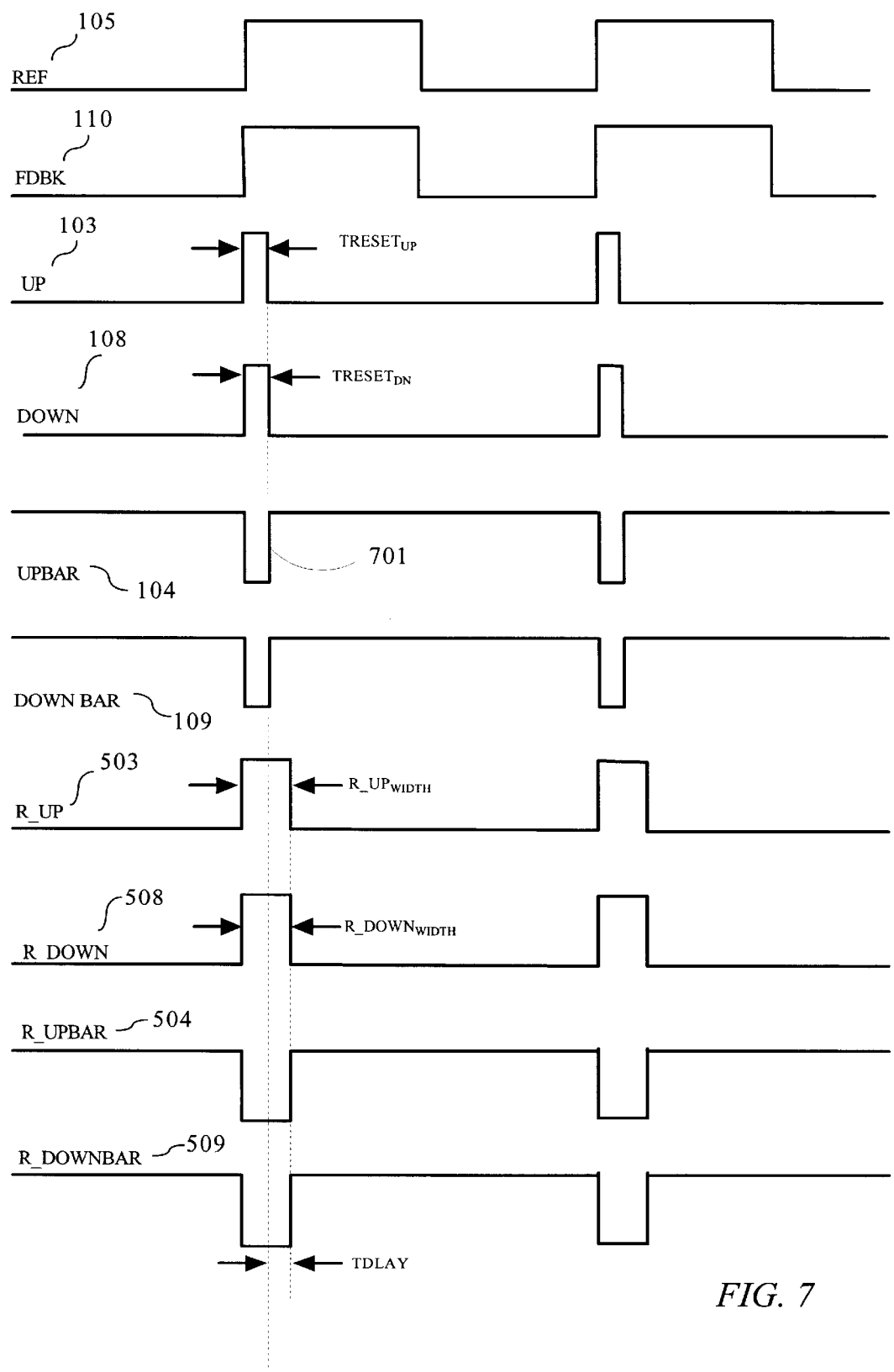
FIG. 7 is an illustration of waveforms of circuitry of the present invention illustrating a locked condition.

FIG. 6 is an illustration of the waveforms resulting when signals REF 105 and FDBK 110 are inputted to exemplary circuits as shown in FIG. 1 and FIG. 5 respectively. In FIG. 6 outputs UP 103, DOWN 108, UPBAR 104 and DOWNBAR 109 are from the circuit depicted in FIG. 1 and R_UP 503, R_DOWN 508, R_UPBAR 504 and R_DOWNBAR 509 are from the circuit depicted in FIG. 5. The waveforms in FIG. 6 result when the two signals REF 105 and FDBK 110 are out of phase. FIG. 7 show the same outputs when REF 105 and FDBK 110 are in phase. Note that whenever the two signals are in phase in FIG. 7 the positive edge of UPBAR 104 (shown as 701) falls within R—UP 503. Since the width of R—UP 503 is determined by a delay element, the amount of coincidence between the positive edge of UPBAR 104 and R—UP 503 can be controlled. Signals UP 103 and R_UP 503 are generated off the same edge of REF 105, however R_UP 503 goes to a logic zero when UP 103 goes to a logic one. When REF 105 and FDBK 110 are out of phase the width of UP 103 being greater the width of R_UP 503 guarantees that there is some time during which both signals are positive. However, when REF 105 and FDBK 110 are in phase UP 103 will fall within the negative portion of R_UP 503 and the two signals are never positive at the same time. Signals DOWNBAR 109 and R_DOWN 508 are generated on the same edge of FDBK 110. DOWNBAR 109 is a pulse width determined essentially by a D-latch reset time while R_DOWN 508 is set by a delay element whose delay time is longer that the D-latch reset time. As long as FDBK 110 lags REF 105 these two signals will have a time during which they are both positive. If REF 105 lags FDBK 110 the characteristics of the UP signals and the DOWN signals become reversed.

Figure 4:
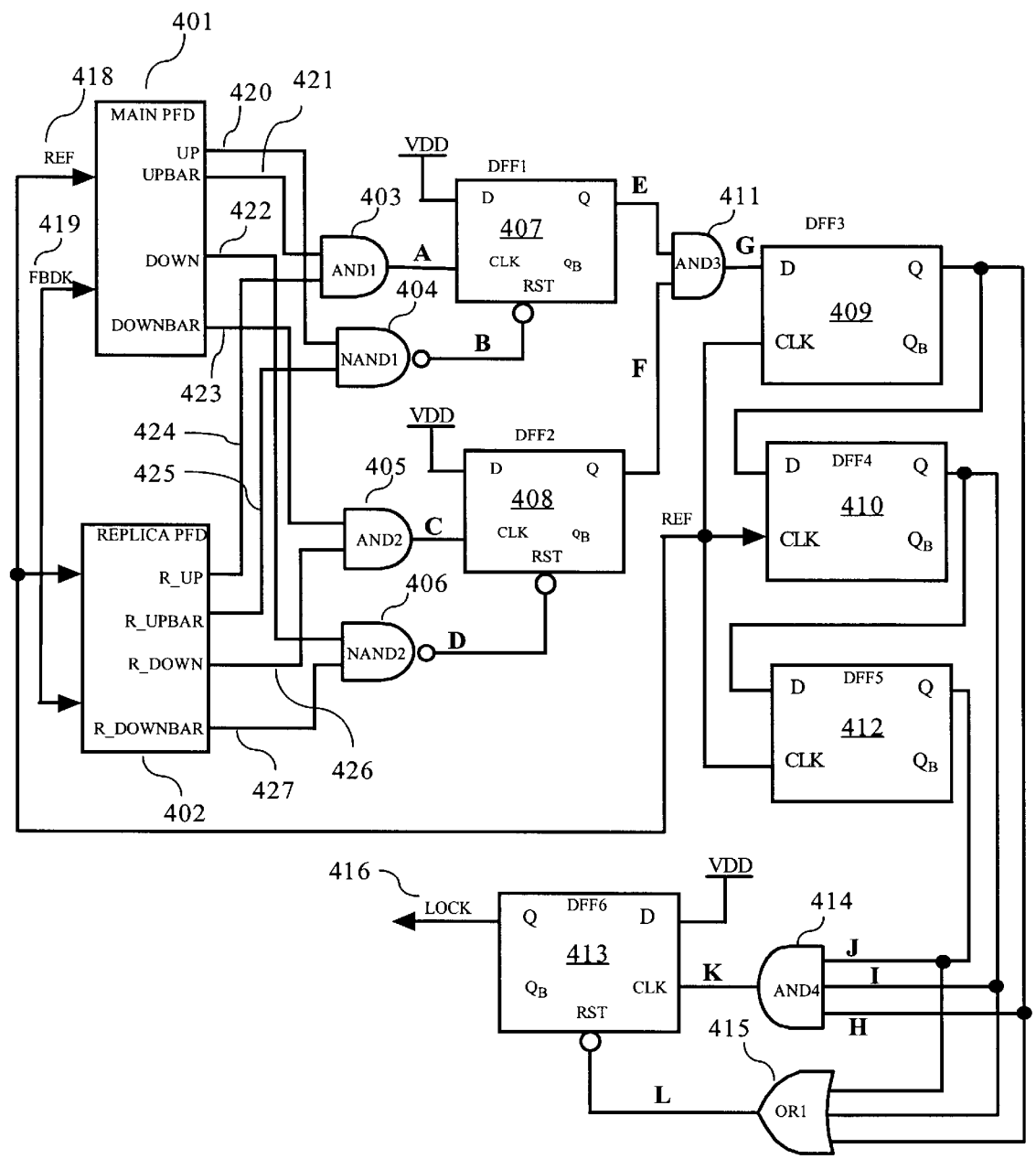
FIG. 4 is a circuit diagram for a circuit used in embodiments of the present invention.

FIG. 4 is a circuit schematic of a phase lock indicator in one embodiment of the present invention. Main PFD 401 is comprised of the circuitry illustrated in FIG. 1 which generates a signal (UP 420) proportional to the phase error between REF 418 and FDBK 419, when REF 418 leads FDBK 419. If REF 418 leads FDBK 419, DOWN 422 is a pulse synchronous with the positive edge of FDBK 419 and with a width essentially the reset time of one D-latch making up Main PFD 401. UPBAR 421 is the complement of UP 420, and DOWNBAR 423 is the complement of DOWN 422. Replica PFD 402 in FIG. 4 generates fixed pulse widths and their complements of the positive edges of both REF 418 and FDBK 419. These pulses are used as windows to indicate when the two signals are in phase.

The circuit made up of gates AND1 403, NAND1 404 and latch DFF1 407 generates a phase lock signal A and the circuit made up of like gates AND2 405, NAND2 406 and latch DFF2 408 generates an enable signal B when REF 418 leads FDBK 419. The roles of these two circuits swap when FDBK 419 leads REF 418. Only the case where REF 418 leads FDBK 419 will be discussed in detail since the other case is the same with only the roles of REF 418 and FDBK 419 reversed.

As discussed earlier, when REF 418 is out of phase with FDBK 419 an UPBAR 421 signal is never at a logic one the same time as an R_UP 424. Since these two signals are ANDed in AND1 403, signal A is always a logic zero when REF 418 is out of phase with FDBK 419. Likewise, as discussed earlier, when REF 418 is out of phase with FDBK 419 a signal UP 420 is always at a logic one for a time coincident with a signal R_UPBAR 425 being at a logic one. These two signals are ANDed in NAND1 404 and signal B is at a logic zero when the phase difference of REF 418 and FDBK 419 is such that the width of UP 420 is larger than the width of R_UPBAR 425. As long as REF 418 and FDBK 419 are out of phase, signal A is at a logic zero and signal B is at a logic zero at the positive edge of a REF 418 cycle; signal A never clocks latch DFF1 407 to a one and signal B keeps latch DFF1 407 reset to a logic zero and acts as an enable signal. As soon as UP 420 falls into the window set by the Replica PFD 402, signal B removes the reset to DFF1 407 and the first positive transition of signal A sets latch DFF1 407 to a logic one signaling that the signals REF 418 and FDBK 419 are in phase.

During the time that REF 418 and FDBK 419 are in phase or while REF 418 leads FDBK 419, latch DFF2 408 is always set to a logic one and signal F enables gate AND3 411. When the first phase lock is signaled by the signal E, gate AND3 411 sets the data input to D-latch DFF3 409 to a logic one. The next positive transition of REF 418 will likewise set DFF3 409 to a logic one. Correspondingly, the output of DFF3 409 sets the data input to DFF4 410 and a succeeding positive transition on REF 418 will set latch DFF4 410 to a logic one. In the embodiment in FIG. 4, the phase lock signal E must remain at a logic one for three consecutive transitions on REF 418 before all three signals J, I, and H are at a logic one, and signal K will set latch DFF6 to a logic one generating LOCK 416 the phase lock indication. When any one of the signals J, I, or H are at a logic one gate OR1 415 removes the reset from DFF6 413. In a similar manner as described above REF 418 and FDBK 419, once a lock indication was signaled on LOCK 416, would have to lose and maintain an unlock condition before a logic zero would propagate through latches DFF3 409, DFF4 410 and DFF5 412 setting J, I and H to a logic zero and resetting latch DFF6 413 via reset input L. As stated earlier, when REF 418 lags FDBK 419, the roles of latches DFF1 407 and DFF2 408 reverse and the same explanation describes the circuit operation.

The phase lock indicator in FIG. 4 requires a lock signal G and three consecutive transitions of REF 418 to generate a lock indicator signal LOCK 416. Additional latches may be added in series with DFF5 412 along with addition inputs to gates AND4 414 and OR1 415 to create a requirement of more than three consecutive transitions of REF 418 to set a LOCK 416 indication. It is possible using embodiments of the present invention and an independent chain of D-latches feeding an OR gate like OR1 415 to create a different number of transitions required for the set of a lock indication than the number of transitions required to reset a lock indication.

Figure 8:
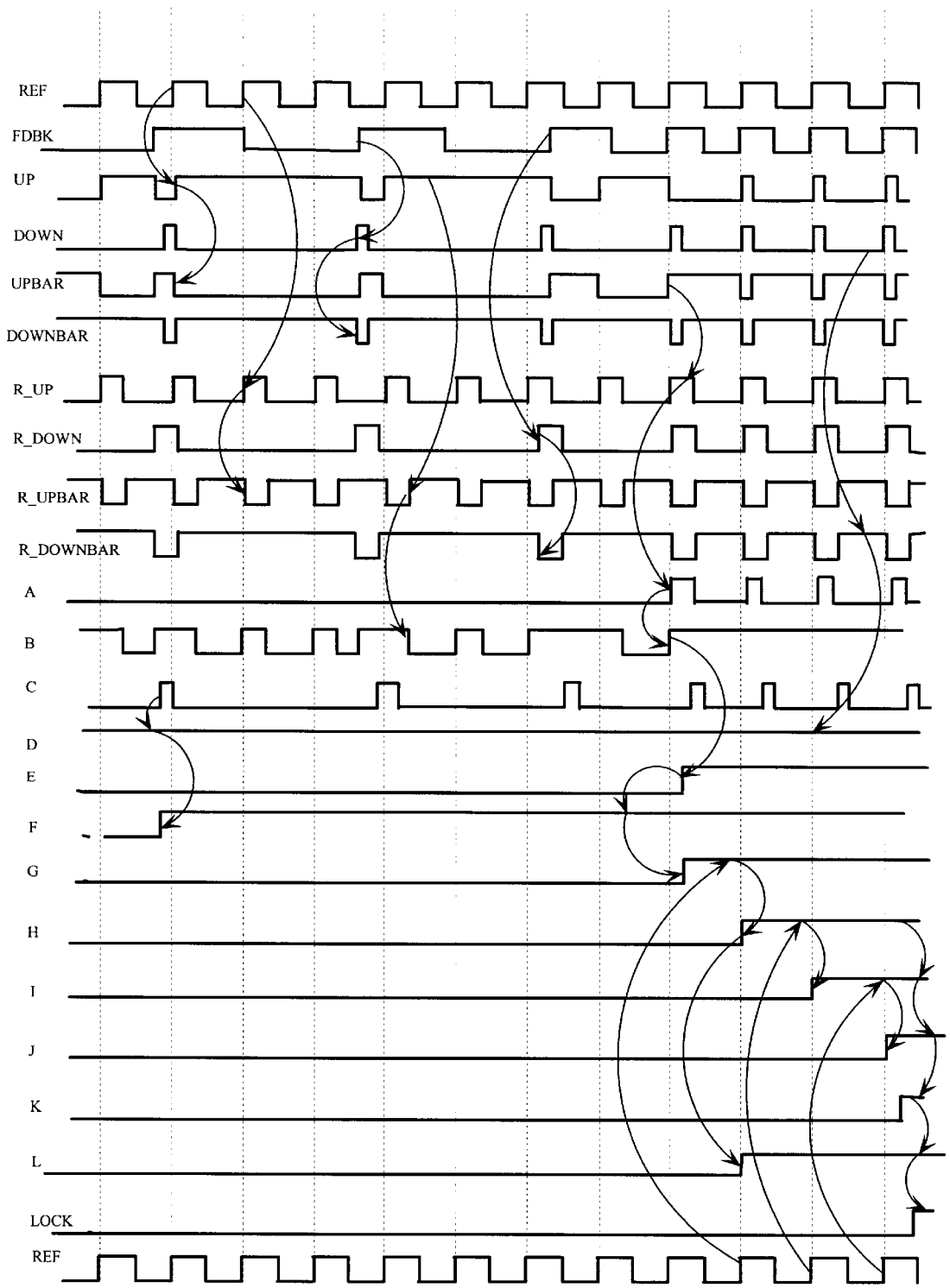
FIG. 8 is an illustration of waveforms of circuitry showing signals prior to and after a lock condition.

FIG. 8 is a logic timing diagram of the nodes of the circuitry in FIG. 4 showing signals before and after a lock condition.

Although the present invention and its advantages have been described in detail, it should be understood that various changes, substitutions and alterations can be made herein without departing from the spirit and scope of the invention as defined by the appended claims.

What is claimed is:

1. A method of phase lock indication of a first logic signal and a second logic signal comprising the steps of:
   generating a phase lock signal when said first and second logic signals are in phase and a phase unlock signal when said first and second logic signals are not in phase;
   counting a number N of consecutive transitions of said first logic signal occurring during said phase lock signal; and
   setting a lock indication circuit to one state indicating a lock condition when said number N is reached by said counting step.

2. The method of claim 1, further comprising the steps of:
   counting a number M of consecutive transitions of said first logic signal occurring during said phase unlock signal; and
   resetting said lock indication circuit to another state indicating an unlocked condition when said number M is reached.

3. The method of claim 2, wherein N and M are equal.

4. The method of claim 1, wherein generating said phase lock signal comprises the steps of:
   generating first and second digital phase error signals, said first digital phase error signal having a pulse width proportional to the phase error between like transition edges of said first and second logic signals and commencing on the leading of said first and second logic signals, said second digital phase error signal having a fixed pulse width and commencing on the positive transition of the lagging of said first and second logic signals;
   generating the complements of said first and second digital phase error signals;
   generating, on like transition edges of said first and second logic signals, first and second window pulses each having a width; said window pulse widths proportional to fixed delay elements;
   generating from said digital phase error signals, said complement digital phase error signals, and said window pulses an enable signal and said phase lock signal, said phase lock signal being logic true when said phase error signals are coincident and within said window pulses;
   counting a number N of consecutive transitions of a reference signal occurring while said phase lock signal is logic true; and
   setting a lock indication latch to one state indicating said lock condition when said number N is reached.

5. The method of claim 4, further comprising;
   counting a number M of consecutive transitions of said first logic signal occurring when said phase lock signal is a logic false; and
   resetting said lock indication circuit to another state indicating an unlocked condition when said number M is reached.

6. The method of claim 5, wherein N and M are equal.

7. A system for indicating the phase lock of a first logic signal and a second logic signal comprising:
   a phase detector circuit receiving as inputs said first and second logic signals and generating phase detector output signals;
   a window pulse generator receiving as inputs said first and second logic signals and generating window pulse output signals;
   a phase lock circuit receiving said phase detector output signals and said window pulse output signals and generating a phase lock signal;
   a counting circuit receiving said phase lock signal and said first logic signal and generating a first and second count signal; and
   a phase lock indicator circuit, said phase lock indicator circuit having a phase lock indicator signal, said phase lock indicator signal set to a logic one by said first count signal and reset to a logic zero by said second count signal.

8. The system of claim 7, wherein said phase detector output signals comprise:
   a first phase detector and complement first phase detector output signals with pulse widths proportional to the difference in phase between like transitions of said first and second logic signals; and
   a second phase detector and complement second phase detector output signals with fixed pulse widths independent of said phase difference and commencing on an edge of said first logic signal.

9. The system of claim 7, wherein said window pulse output signals comprise:
   a first window and complement first window output signals with pulse widths dependent on a delay element and commencing on a first transition edge of said first logic signal; and
   a second window and complement second window output signals with pulse widths dependent on said delay element and commencing on said same first transition edge of said second logic signal.

10. The system of claim 7, wherein said phase lock signal is generated when one of said phase detector output signals is coincident with one of said window output signals indicating a phase lock of said first and second logic signals.

11. The system of claim 10, wherein said phase lock signal is set to a logic one when said first and second logic signals are phase locked and reset to a logic zero when said first and second logic signals are not phase locked.

12. The system of claim 7, wherein said counting circuit comprises:
a multistage D-latch shift register, said multistage D-latch shift register receiving said phase lock signal as an input and said first logic signal as a clock;
a multiple input AND gate, said AND gate receiving as input an output of each of said D-latches in said shift register;
an AND gate having as inputs each output of said multistage D-latch shift register and generating as an output a phase lock indicator clock; and
an OR gate having as inputs each of said outputs of said multistage D-latch shift register and generating as an output a phase lock indicator reset.

13. The system of claim 12, wherein said phase lock indicator circuit is a D-latch with said first count signal as said clock and said second count signal as a reset.

14. The system of claim 13, wherein said first count signal is said phase lock indicator clock.

15. The system of claim 13, wherein said second count signal is said phase lock indicator reset.

16. A processor system, comprising:
one or more microprocessor integrated circuits;
random access memory (RAM); and
interconnecting circuitry for connecting said microprocessor integrated circuit(s) and said RAM; said microprocessor integrated circuit(s), said RAM, and said interconnecting circuitry further comprising loop circuitry comprising one or more loops, each loop being either a PLL or a DLL, said loop circuitry further comprising:
a phase detector circuit receiving as inputs first and second logic signals and generating phase detector output signals;
a window pulse generator receiving as inputs said first and second logic signals and generating window pulse output signals;
a phase lock circuit receiving said phase detector output signals and said window pulse output signals and generating a phase lock signal;
a counting circuit receiving said phase lock signal and said first logic signal and generating a first and second count signal; and
a phase lock indicator circuit, said phase lock indicator circuit having a phase lock indicator signal, said phase lock indicator signal set to a logic one by said first count signal and reset to a logic zero by said second count signal.

17. The processor system of claim 16, wherein said phase detector output signals comprise:
a first phase detector and complement first phase detector output signals with pulse widths proportional to the difference in phase between like transitions of said first and second logic signals; and
a second phase detector and complement second phase detector output signals with fixed pulse widths independent of said phase difference and commencing on an edge of said first logic signal.

18. The processor system of claim 16, wherein said window pulse output signals comprise:
a fist window and complement first window output signals with pulse widths dependent on a delay element and commencing on a first transition edge of said first logic signal; and
a second window and complement second window output signals with pulse widths dependent of said delay element and commencing on said same first transition edge of said second logic signal.

19. The processor system of claim 16, wherein said phase lock signal is generated when one of said phase detector output signals is coincident with one of said window output signals indicating a phase lock of said first and second logic signals.

20. The processor system of claim 19, wherein said phase lock signal is set to a logic one when said first and second logic signals are phase locked and reset to a logic zero when said first and second logic signals are not phase locked.

21. The processor system of claim 16, wherein said counting circuit comprises:
a multistage D-latch shift register, said multistage D-latch shift register receiving said phase lock signal as an input and said first logic signal as a clock;
a multiple input AND gate, said AND gate receiving as input an output of each of said D-latches in said shift register;
an AND gate having as inputs each output of said multistage D-latch shift register and generating as an output a phase lock indicator clock; and
an OR gate having as inputs each of said outputs of said multistage D-latch shift register and generating as an output a phase lock indicator reset.

22. The processor system of claim 21, wherein said phase lock indicator circuit is a D-latch with said first count signal as said clock and said second count signal as a reset.

23. The processor system of claim 22, wherein said first count signal is said phase lock indicator clock.

24. The processor system of claim 22, wherein said second count signal is said phase lock indicator reset.

25. A processor, comprising:
loop circuitry comprising one or more loops, each loop being either a PLL or a DLL, said loop circuitry further comprising:
a phase detector circuit receiving as inputs first and second logic signals and generating phase detector output signals;
a window pulse generator receiving as inputs said first and second logic signals and generating window pulse output signals;
a phase lock circuit receiving said phase detector output signals and said window pulse output signals and generating a phase lock signal;
a counting circuit receiving said phase lock signal and said first logic signal and generating a first and second count signal; and
a phase lock indicator circuit, said phase lock indicator circuit having a phase lock indicator signal, said phase lock indicator signal set to a logic one by said first count signal and reset to a logic zero by said second count signal.

26. The processor of claim 25, wherein said phase detector output signals comprise:
a first phase detector and complement first phase detector output signals with pulse widths proportional to the difference in phase between like transitions of said first and second logic signals; and a second phase detector and complement second phase detector output signals with fixed pulse widths independent of said phase difference and commencing on [[and]] an edge of said fist logic signal.

27. The processor of claim 25, wherein said window pulse output signals comprise:

a first window and complement first window output signals with pulse widths dependent on a delay element and commencing on a first transition edge of said first logic signal; and a second window and complement second window output signals with pulse widths dependent of said delay element and commencing on said same first transition edge of said second logic signal.

28. The processor of claim 25, wherein said phase lock signal is generated when one of said phase detector output signals is coincident with one of said window output signals indicating a phase lock of said first and second logic signals.

29. The processor of claim 28, wherein said phase lock signal is set to a logic one when said first and second logic signals are phase locked and reset to a logic zero when said first and second logic signals are not phase locked.

30. The processor of claim 25, wherein said counting circuit comprises:

a multistage D-latch shift register, said multistage D-latch shift register receiving said phase lock signal as an input and said first logic signal as a clock;

a multiple input AND gate, said AND gate receiving as input an output of each of said D-latches in said shift register;

an AND gate having as inputs each output of said multistage D-latch shift register and generating as an output a phase lock indicator clock; and an OR gate having as inputs each of said outputs of said multistage D-latch shift register and generating as an output a phase lock indicator reset.

31. The processor of claim 30, wherein said phase lock indicator circuit is a D-latch with said first count signal as said clock and said second count signal as a reset.

32. The processor of claim 31, wherein said first count signal is said phase lock indicator clock.

33. The processor of claim 31, wherein said second count signal is said phase lock indicator reset.

* * * * *